United States Patent
Kuo et al.

(10) Patent No.: US 9,680,486 B2
(45) Date of Patent: Jun. 13, 2017

(54) DCO PHASE NOISE WITH PVT-INSENSITIVE CALIBRATION CIRCUIT IN ADPLL APPLICATIONS

(71) Applicant: Taiwan Semiconductor Manufacturing Company, Ltd., Hsinchu County (TW)

(72) Inventors: Feng Wei Kuo, Zhudong Township (TW); Kuang-Kai Yen, Kaohsiung (TW); Jinn-Yeh Chien, Chu Bei (TW); Chewn-Pu Jou, Hsinchu (TW); Robert Bogdan Staszewski, Delft (NL)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/848,713

(22) Filed: Sep. 9, 2015

(65) Prior Publication Data

US 2017/0070231 A1    Mar. 9, 2017

(51) Int. Cl.
  *H03L 7/099*    (2006.01)
(52) U.S. Cl.
  CPC .................. *H03L 7/0991* (2013.01)
(58) Field of Classification Search
  CPC ....... H03L 7/0991; H03L 7/093; H03L 7/099; H03L 7/18; H03L 7/091; H03L 7/083; H03L 7/16; H03L 7/0998; H03L 7/081; H03L 7/095; H03L 7/08
  USPC .......... 327/156, 158, 161; 375/371, 375, 376
  See application file for complete search history.

(56) References Cited

U.S. PATENT DOCUMENTS

| | | | |
|---|---|---|---|
| 8,368,437 B2 | 2/2013 | Huang et al. | |
| 8,456,207 B1 | 6/2013 | Kuo et al. | |
| 8,547,151 B2 | 10/2013 | Kuo et al. | |
| 8,570,082 B1 | 10/2013 | Kuo et al. | |
| 8,593,189 B1 * | 11/2013 | Yen ......................... | H03L 7/085 327/147 |
| 8,890,626 B2 | 11/2014 | Chen et al. | |
| 9,065,454 B2 | 6/2015 | Lin | |
| 9,112,507 B2 | 8/2015 | Chen et al. | |
| 2008/0315928 A1 * | 12/2008 | Waheed ................ | G04F 10/005 327/159 |
| 2013/0285722 A1 | 10/2013 | Chou | |
| 2015/0162921 A1 | 6/2015 | Chen | |
| 2015/0194971 A1 | 7/2015 | Tsai | |

OTHER PUBLICATIONS

Berny, et al., "A 1.8-GHz LC VCO With 1.3-GHz Tuning Range and Digital Amplitude Calibration," *IEEE Journal of Solid-State Circuits*, 40:4, pp. 909-917 (2005).

\* cited by examiner

*Primary Examiner* — John Poos
(74) *Attorney, Agent, or Firm* — Sterne, Kessler, Goldstein & Fox P.L.L.C.

(57) ABSTRACT

A calibration procedure that uses direct measurement of digital phase error performance for low cost calibration of all-digital phase locked loop (ADPLL)/digitally-controlled oscillator (DCO) is described. Direct measurement of digital phase error, or difference in digital phase error, is used to adjust the operating point of the DCO and thereby determine the operating point that provides the optimal phase noise of the output signal. Calibration may be performed at any time so that changes in external factors such as process, voltage and temperature (PVT) may be incorporated into the setting of the operating point of the DCO.

20 Claims, 9 Drawing Sheets

DCO PHASE NOISE WITH PVT-INSENSITIVE CALIBRATION CIRCUIT IN ADPLL APPLICATIONS

BACKGROUND

This application generally relates to the field of phase locked oscillators.

A phase-locked loop (PLL) circuit is an electronic control circuit that generates an output clock signal having a phase that is locked to the phase of an input reference signal. By using a highly stable input reference signal, the output clock signal can be made to be also highly stable. A PLL circuit is commonly used in communication devices, computers, and other electronic devices. An analog PLL circuit uses analog components to provide the phase-lock architecture. These analog components include a phase detector, a voltage-controlled oscillator (VCO), and a feedback path between the VCO output signal and an input port of the phase detector. By connecting the input reference signal to another input port of the phase detector, the output of the phase detector may be used to adjust the phase of the VCO output signal until that phase is locked to the input reference signal.

A PLL circuit may also be implemented using all digital components. Such a PLL circuit is known as an all-digital PLL (ADPLL) circuit. Like its analog counterpart, an ADPLL circuit uses a feedback path to return a digitally-controlled oscillator (DCO) clock signal to generate a digital phase error signal based on the output from a time-to-digital converter (TDC) and a reference phase signal. In response to the digital phase error signal, the phase of the DCO clock signal is adjusted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Embodiments of the present invention will be described with reference to the accompanying drawings.

DETAILED DESCRIPTION

Figure 1:
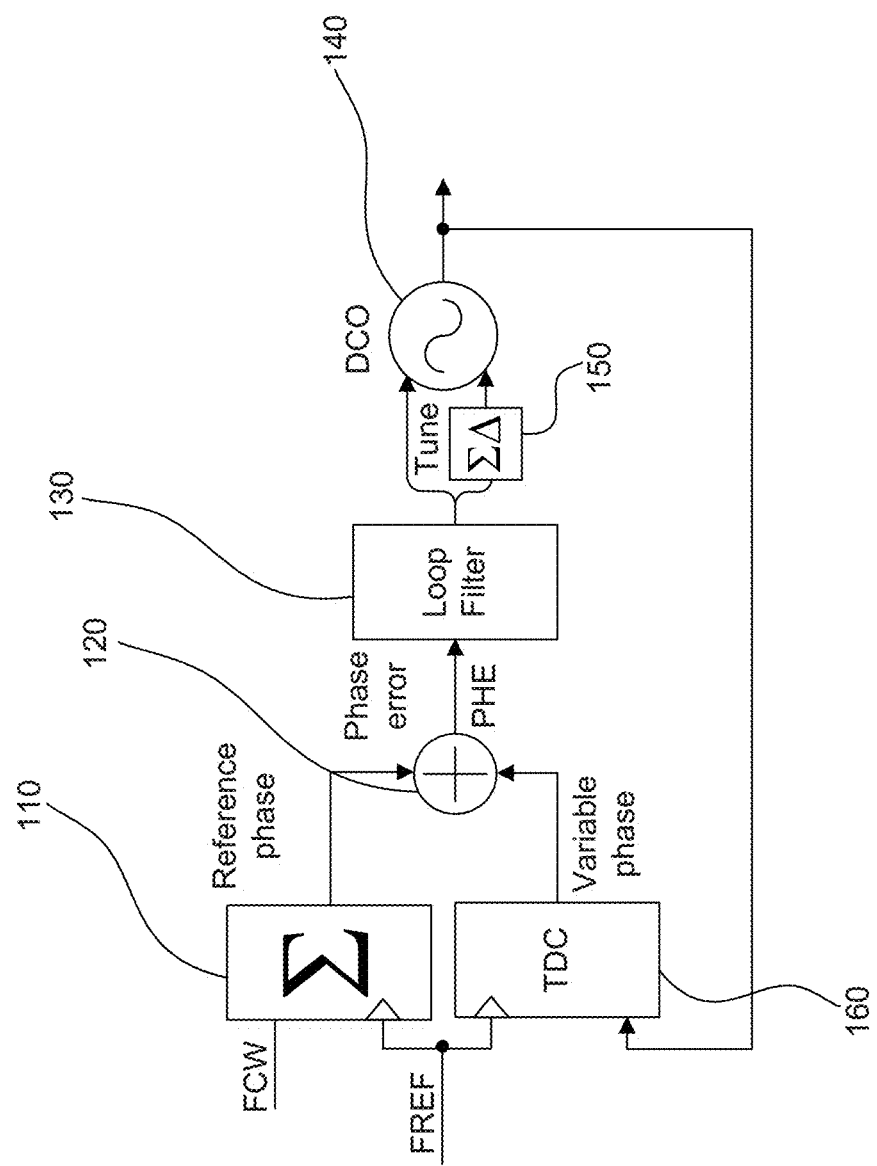
FIG. 1 illustrates an all-digital phase-locked loop (ADPLL), in accordance with various embodiments.

FIG. 1 illustrates an all-digital phase-locked loop (ADPLL), in accordance with embodiments of the present approach. A frequency control word (FCW) is provided to a summer 110, which outputs a reference phase. A reference frequency (FREF) is also input to summer 110. The reference phase is provided to summer 120, which in turn outputs a phase error signal PHE. The phase error signal PHE is provided to loop filter 130, which in turn adjusts digitally controlled oscillator (DCO) 140 through the use of a tuning signal and the output of a sigma-delta modulator 150. DCO 140 outputs an output clock signal, a portion of which is returned via a feedback path to a time-to-digital-converter (TDC) 160. TDC 160 also receives as input the reference frequency. TDC 160 outputs a variable phase signal that is input to summer 120 to form the resulting phase error. All components that interact with DCO 140 are digital, i.e., summer 120, loop filter 130, sigma-delta modulator 150, and TDC 160 are digital components.

Figure 2:
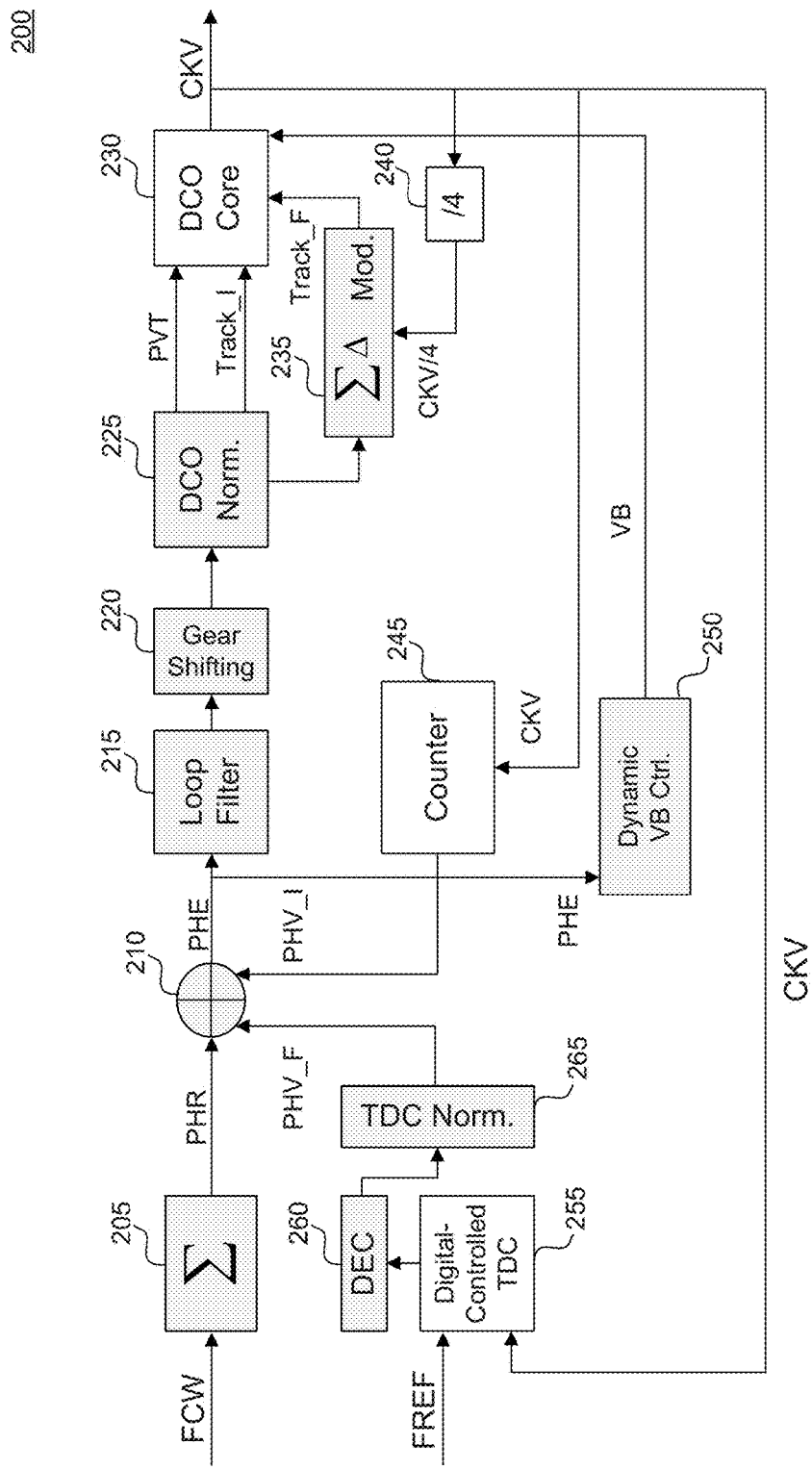
FIG. 2 illustrates a calibration approach for the ADPLL architecture of FIG. 3, in accordance with various embodiments.

FIG. 2 illustrates a tuning and calibration approach, as applied to the ADPLL architecture illustrated in FIG. 1, in accordance with embodiments of the present approach. Conceptually, the ADPLL architecture may be considered to have three sections: a DCO (shown by DCO core 230), a locking circuit (shown by summer 205, summer 210, loop filter 215, gear shifting module 220. DCO normalization block 225, sigma delta modulator 235, counter 245, time-to-digital converter (TDC) 255 and TDC normalization block 265), and controller circuit (shown by dynamic VB controller 250). A frequency control word (FCW) and a reference frequency (FREF) are provided to summer 205, which outputs a reference phase, PHR. The reference phase PHR is provided to summer 210, which in turn outputs a digital phase error signal PHE. The digital phase error signal PHE is provided to loop filter 215, which in turn provides a signal to gear shifting module 220. Gear shifting module 220 provides different "gears" (or different acquisition algorithms having different acquisition speeds) during the course of the acquisition (or locking) procedure. The output of gear shifting module 220 is fed to DCO normalization block 225, which in turns provides the tuning signal PVT, the integer tracking signal Track_I and the input signal to sigma-delta modulator 235. DCO core 230 is adjusted through the use of tuning signal PVT, integer tracking signal Track_I, and a fractional tracking signal Track_F resulting from sigma-delta modulator 235. DCO 230 outputs an output clock signal CKV, which is provided to a divider 240 (in the exemplary illustration, the divider is division by 4, but the divider can provide division by an integer) that in turn provides a signal to sigma-delta modulator 235. The output clock signal CKV is also provided to counter 245, which outputs an integer variable phase signal PHV_I that is in turn provided to summer 210. The output clock signal is also returned via a feedback path to time-to-digital-converter (TDC) 255. TDC 255 also receives the reference frequency FREF as input. TDC 255 outputs a signal to decimator 260, the output of which is provided to TDC normalization block 265. TDC normalization block 265 outputs a variable fractional phase signal PHV_F that is input to summer 210 to form the resulting digital phase error signal PHE. The digital phase error signal PHE is used as input to dynamic VB controller 250, which is used to tune and calibrate DCO core 230.

Figure 3:
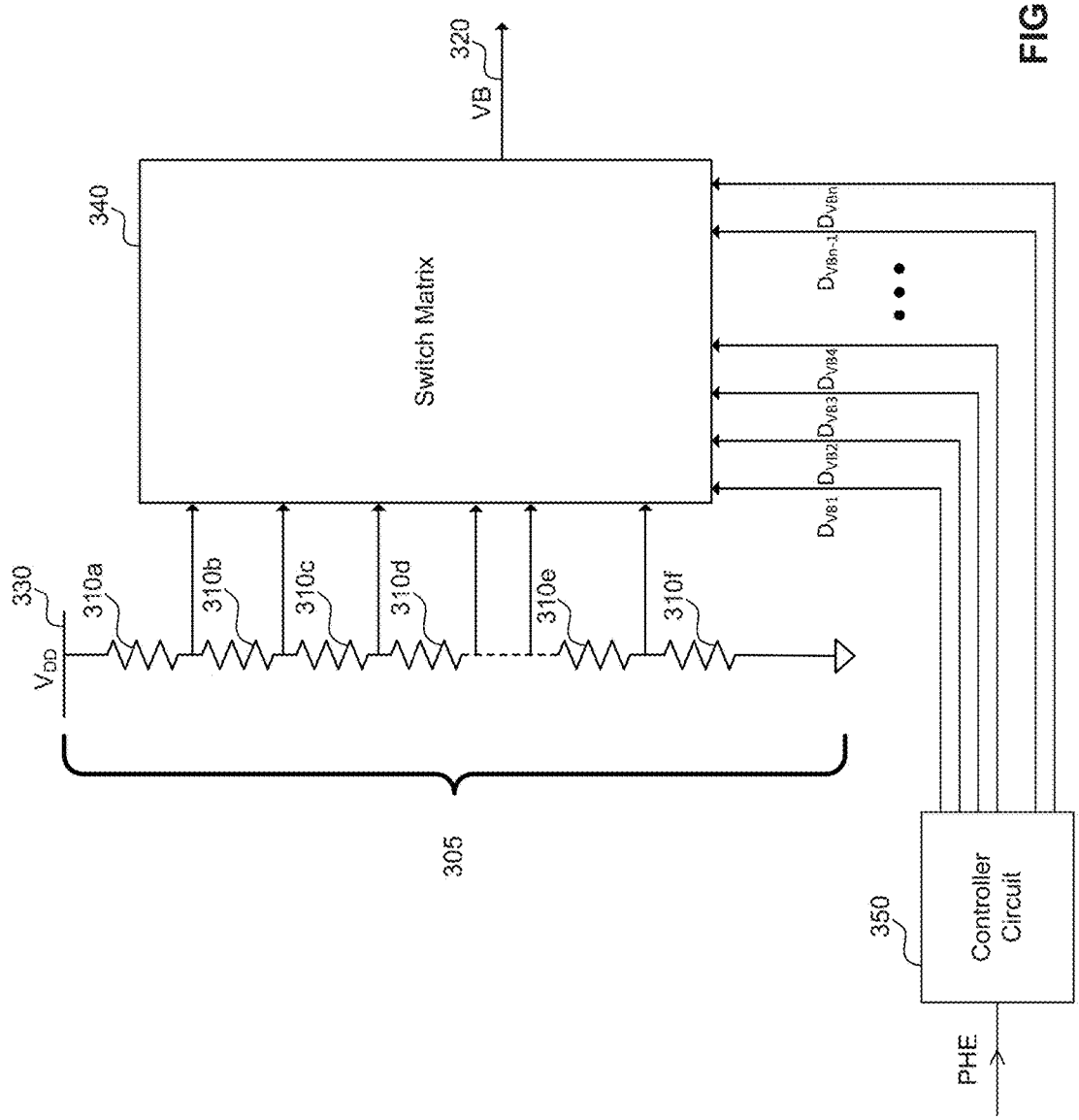
FIG. 3 illustrates a resistor ladder for use within a dynamic VB controller of FIG. 4, in accordance with some embodiments.
Figure 4:
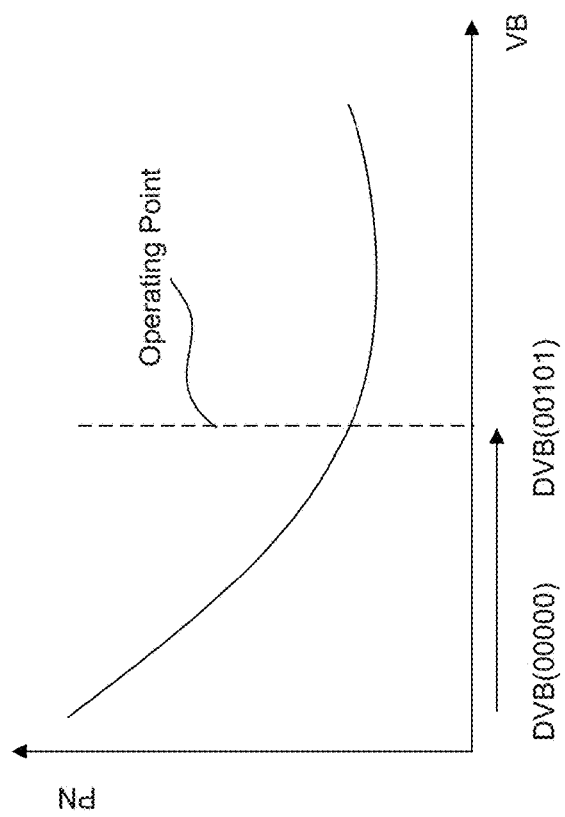
FIG. 4 illustrates the variation of phase noise of a DCO with increasing digital control word DVB, in accordance with some embodiments.

FIG. 3 provides an embodiment of dynamic VB controller 250. Digital phase error signal PHE is input to controller circuit 350 that outputs a multi-bit digital control word DVB1, DVB2, . . . DVBn (in this case an n-bit word). The value of the multi-bit digital control DVB is based on digital phase error signal PHE, and the type of analysis performed by controller circuit 350. The different types of analyses are discussed later this specification. Continuing to refer to FIG. 3, resister ladder 305 includes resistors 310a, 310b, . . . 310f that are connected in series. In an embodiment, resistors 310a, 310b, . . . 310f may be of equal values of resistance. In another embodiment, resistors 310a, 310b, . . . 310f are of unequal values of resistance. Resistor 310a is connected to power supply voltage VDD 330, while resistor 310f is connected to ground. Multi-bit digital control word DVB is connected as an input to switch matrix 340 so as to provide various connections to the taps (or connection points) in resistor ladder 305 for an output signal VB 320. For each value of input multi-bit digital control word DVB, switch matrix 340 provides output signal VB 320 using input voltages available at tap points located between resistors 310a, 310b, . . . 310f. In some embodiments, switch matrix 340 is constructed so that increasing values of multi-bit digital control word DVB results in an increasing value of output signal VB 320. Thus, output signal VB 320 is output from taps in resistor ladder 305 based on application of multi-bit digital control word DVB to switch matrix 340. Resistors 310a, 310b, . . . 310f act as voltage dividers between the power supply voltage VDD 330 and ground. Each tap of resistor ladder 305 generates a different voltage compared with the voltage available at another tap. Digital control of the connections of the taps in resistor ladder 305 using switch matrix 340 results in a different output signal VB 320. Thus, by appropriate selection of the value of multi-bit digital control word DVB, DCO core 230 may be tuned and calibrated across its operating range through the use of different values of output signal VB 320. A calibration mode signal (not shown) may be used to activate/deactivate the controller circuit such as dynamic VB controller 250. FIG. 4 illustrates how the phase noise (PN) of DCO core 230 would vary with increasing digital control word DVB. One of ordinary skill in the art would understand that increasing digital control word DVB leads to increasing output voltage VB 320, which in turn leads to increasing current in DCO core 230, and a resulting decrease in phase noise (noise is measured relative to the increased signal amplitude of output clock signal CKV). Thus, by increasing the voltage VB 320 using an increasing value of multi-bit digital control word DVB, the phase noise of DCO core 230 will improve until the output clock signal CKV of DCO core 230 approaches a minimum point. As FIG. 4 illustrates, further increases in the value of multi-bit digital control word DVB may result in increases in the phase noise of DCO core 230 after the phase noise reaches the minimum point. FIG. 4 illustrates a value of multi-bit digital control word DVB that results in an operating point that has a higher phase noise than the minimum phase noise achievable from DCO core 230. The table below illustrates values that are representative of the phase error and phase noise of DCO core 230 as a function of DVB control word. Phase noise, expressed in dBc/Hz, expresses the variation of phase noise versus frequency offset from the signal. In the table below, the frequency offset for the phase noise is 100 kHz. Phase error expresses the total phase error resulting from the accumulated phase noise.

| DVB Control Word | Phase Error (degrees) | Phase Noise (dBc/Hz) |
|---|---|---|
| 00000 | +/−0.5 | −90 |
| 00001 | +/−0.4 | −95 |
| 00010 | +/−0.3 | −100 |
| 00011 | +/−0.2 | −105 |
| 00100 | +/−0.1 | −110 |
| 00101 | +/−0.015 | −115 |
| 00110 | +/−0.01 | −115 |

Figure 5:
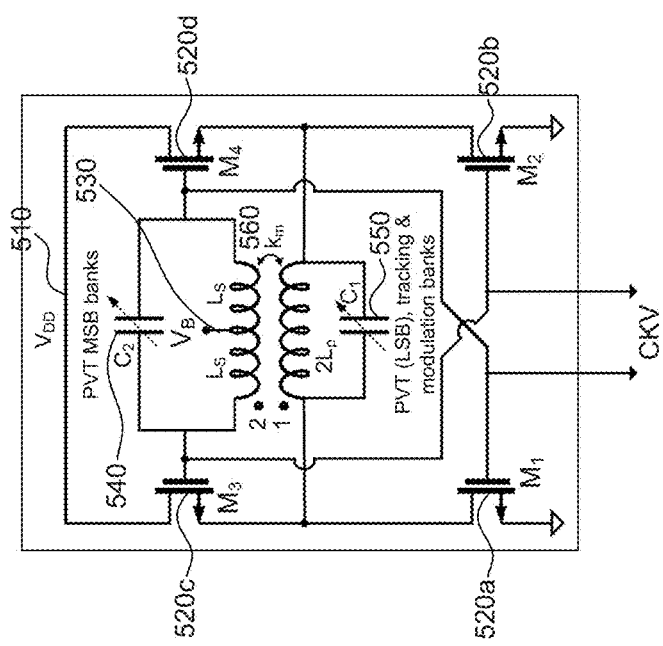
FIG. 5 illustrates an approach for the topology for the DCO of FIG. 4, in accordance with some embodiments.

FIG. 5 illustrates an embodiment for DCO core 230, according to various embodiments of the present approach. In these various embodiments, cross-coupled transistor pairs 520a, 520b, 520c, 520d are used to generate the output clock signal CKV. Power is fed to cross-coupled transistor pairs 520a, 520b, 520c, 520d via power supply voltage VDD 510. The frequency of DCO core 230 is controlled by variable switched array of capacitors. An embodiment of a variable switched array of capacitors is illustrated in FIG. 5 by variable capacitors 540, 550. In various embodiments, variable capacitor 550 is a switched capacitor that is controlled by least significant bits (LSB) of the tuning signal PVT from FIG. 2, while variable capacitor 540 is a switched capacitor that is controlled by most significant bits (MSB) of the tuning signal PVT. Variable capacitor 550 is coupled to be in parallel with variable capacitor 540 through transformer 560. The operation of DCO core 230 is controlled by adjusting the voltage supplied at port 530. The voltage supplied at port 530 is supplied by VB 320 from resistor ladder 305. Other embodiments of DCO core 230 may also be used that have a different topology, but which offer the opportunity to control the operating regime of DCO core 230 using input voltage VB.

Figures 6A, 6B:
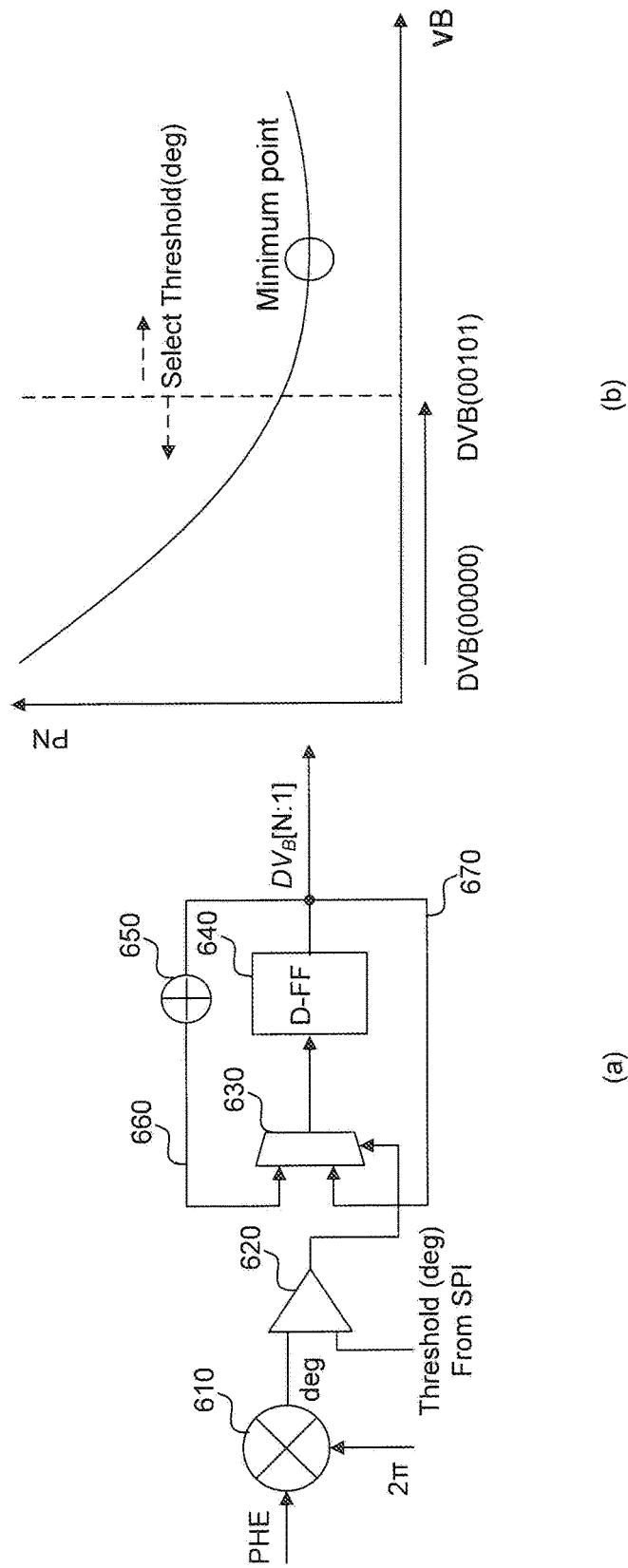
FIGS. 6(a) and 6(b) illustrates an embodiment of a controller circuit that provides a digital control word DVB in response to a digital phase error signal PHE, in accordance with some embodiments.

FIGS. 6(a) and 6(b) illustrates an embodiment of controller circuit 350 of FIG. 2 to provide a digital control word DVB of FIG. 3 in response to a digital phase error signal PHE of FIG. 2, in accordance with various embodiments of the present approach. The digital control word DVB is used to select an operating point that minimizes the digital phase error signal PHE. In FIG. 6(a), the digital phase error signal PHE is normalized to degree units using multiplier 610. Also input to multiplier 610 is the constant, $2\pi$. Here, normalization refers to the procedure by which the digital phase error signal PHE is converted to the equivalent value in units of angular degrees. This normalized digital phase error signal PHE is input to digital comparator 620. A threshold value (provided in degrees as an input to digital comparator 620) is also input to digital comparator 620. If the normalized digital phase error signal exceeds the threshold value, then digital comparator 620 outputs a binary "1." Conversely, if the normalized digital phase error signal does not exceed the threshold value, then digital comparator 620 outputs a binary "0." Digital comparator 620 is connected to the selector port of multiplexor 630 such that a digital comparator output signal of "1" (i.e., input signal of "1" to the selector port) results in the selection of input signal 660. Input signal 660 is the digital control word DVB from the previous cycle but incremented by "1" using adder 650. Conversely, a digital comparator output signal of "0" (i.e., input signal of "0" to the selector port) results in the selection of input signal 670. Input signal 670 is the digital control word DVB from the previous cycle but unchanged. Thus, when the normalized digital phase error signal VHF exceeds the threshold value, the digital control word DVB is increased. Increasing the digital control word DVB results in a lower phase noise, as shown in FIG. 6(b). FIG. 6(b) illustrates the relationship between phase noise PN and digital control word DVB, with the threshold value shown (in degrees). With the lower phase noise resulting from an increased digital control word DVB, the number of times the digital phase error signal PHE exceeds the threshold value (i.e., signal crossings) will decrease. This is because a lower phase noise results in smaller excursions in the random digital phase error signal PHE fluctuations, and thereby a lower number of times that this signal will exceed the threshold value. Eventually, no further increases in the digital control word DVB result in a reduction in the digital phase error signal PHE and an optimal value of digital control word DVB will have been determined. FIG. 6(b) illustrates the minimum phase noise point, i.e., the point with the lowest phase noise. A threshold value is also shown that represents a high phase noise value. Setting the threshold value at a higher phase noise value supports design applications that seek lower current consumption while tolerating a higher phase noise level.

Thus, controller circuit 350 uses the combination of digital comparator 620 and multiplexor 630 to generate a digital control word DVB that acts to quantify the number of times the phase error exceeded the threshold. The threshold value is set above the normal noise of the system so that any digital phase error signal PHE value that exceeds the threshold value can be attributed to DCO phase noise. Setting the threshold at such a value acknowledges the presence of thermal noise that is ever-present in an electrical system. Digital phase error signal PHE values that exceed the threshold value may be referred to as outliers. A larger number of outliers will occur at higher DCO phase noise values. As noted above, this is because a higher phase noise results in larger excursions in the random digital phase error signal PHE fluctuations, and thereby a higher number of times that this signal will exceed the threshold value. In a typical use of the above threshold-crossing measuring approach, the PLL circuit will have already completed its acquisition (or locking) mode, or be close to completion of its acquisition mode. One of ordinary skill in the art would understand that a PLL circuit initially acquires a lock to the reference frequency (i.e., is in an initial acquisition mode), followed by a tracking mode, whereby the PLL circuit maintains the lock to the reference frequency. When the PLL circuit is in its tracking mode (i.e., following completion of the acquisition mode), the digital phase error signal PHE has a zero mean value. One of ordinary skill in the art would understand that the feedback loop in a PLL circuit drives digital phase error signal PHE to an average of zero upon the conclusion of the acquisition mode, at which point lock has been achieved. Upon activation of the above threshold-crossing measuring approach, the number of outlier values may be determined over a certain number of clock cycles that are representative of the DCO performance at that operating point in time. The choice of the number of clock cycles that is representative of DCO performance may be determined by experience. For example, over a total of 512 clock cycles, the digital phase error signal PHE may have exceeded the threshold a total of 123 times. The use of 512 clock cycles is purely for explanatory purposes. In any particular situation, choosing a number of clock cycles that is too few will result in an indication that is not representative of the DCO performance, while choosing a number of clock cycles that is too high will unnecessarily delay obtaining an indication of the DCO performance at the particular operating point. In the above explanatory example, the digital phase error signal PHE exceeded the threshold a total of 123 times. Due to this number of threshold crossings, dynamic VB controller 250 will increase the digital control word DVB value, that will in turn result in a larger bias current to DCO core 230, and therefore a lower DCO phase noise, as explained above. Thus, due to the now-lowered DCO phase noise, only 50 threshold crossings may be recorded in a subsequent 512 clock cycle period, for example. The process of noting that 50 threshold crossings results in a still further increase in the digital control word DVB value, again through the actions of dynamic VB controller 250, which in turn results in a further lowering of DCO phase noise. Eventually, there are zero threshold crossings and dynamic VB controller 250 no longer seeks to increase the bias current to DCO core 230. At this point, the digital control word DVB value stabilizes at the optimal operating point.

Figure 7A:
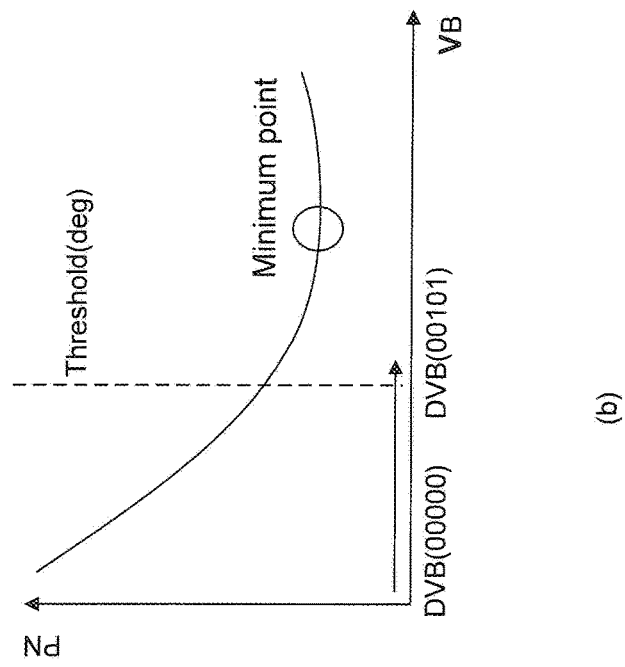
FIGS. 7(a) and 7(b) illustrates another embodiment of a controller circuit that provides a digital control word DVB in response to a digital phase error signal PHE, in accordance with some embodiments.
Figure 7B:
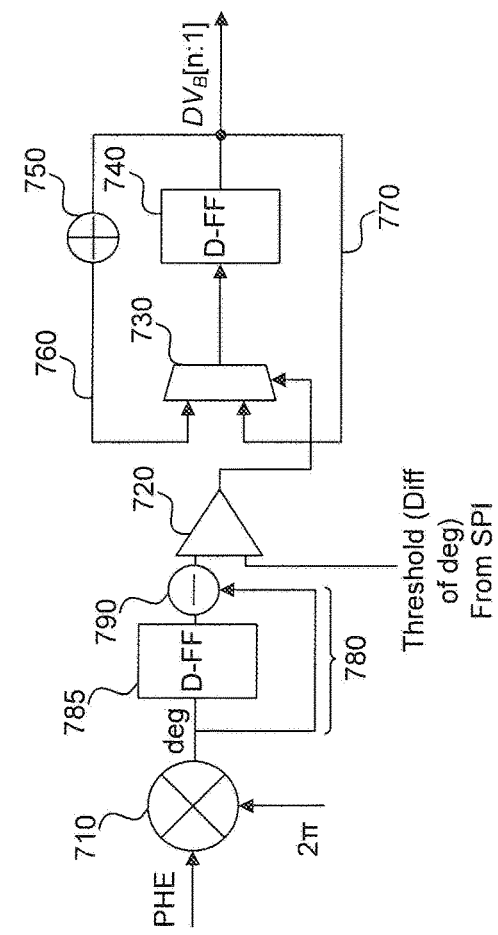

FIG. 7(a) illustrates another embodiment of controller circuit 350 of FIG. 2 using a differentiator module. Although the digital phase error signal PHE of FIG. 4 has a mean of zero at its locked state following the completion of the acquisition mode, the nature of modulated communication signals is such that the mean may be non-zero over an extended period of time before returning to the long term average of zero. For example, certain modulation signals result in time periods where the average value is a positive non-zero value, followed by an offsetting average value that is a negative non-zero value. In these situations, the differentiator module 780 serves to eliminate the transient departure from the zero mean. The differentiator module subtracts the present value from the previous value so that only the delta value is used for subsequent processing. In FIG. 7(a), like in FIG. 6(a), the digital phase error signal PHE is normalized to degree units using multiplier 710. Also input to multiplier 710 is the constant, $2\pi$. The normalized digital phase error signal PHE is input to differentiator module 780, which includes D flip flop 785 and subtractor 790. D flip flop 785 stores the present value of the normalized digital phase error signal, which is then input to subtractor 790. At the next clock cycle, the present value is forwarded to subtractor 790 to provide the difference between the present value and previous values of the normalized digital phase error signal PHE. The output of differentiator 760 is input to digital comparator 720. A threshold value (provided in degrees as an input to this module) is also input to digital comparator 720. If the differentiator output value exceeds the threshold value, then digital comparator 720 outputs a binary "1." Conversely, if the differentiator output value does not exceed the threshold value, then digital comparator 720 outputs a binary "0." Digital comparator 720 is connected to the selector port of multiplexor 730 such that a digital comparator output signal of "1" (i.e., input signal of "1" to the selector port) results in the selection of input signal 760. Input signal 760 is the digital control word DVB from the previous cycle but incremented by "1" using added 750. Conversely, a digital comparator output signal of "0" (i.e., input signal of "0" to the selector port) results in the selection of input signal 770. Input signal 770 is the digital control word DVB from the previous cycle but this time unchanged. Thus, when the differentiator output value exceeds the threshold value, the digital control word DVB is increased. Increasing the digital control word DVB results in a lower phase noise, as shown in FIG. 7(b). FIG. 7(b) illustrates the relationship between phase noise PN and digital control word DVB, with the optimal point shown. As noted previously, controller circuit 350 increases the digital control word DVB value, with resulting increases in the bias current to DCO core 230, and therefore lower DCO phase noise values until no further improvements may be achieved. With the lower phase noise resulting from an increased digital control word DVB, the number of times the digital phase error signal PHE exceeds the threshold value will decrease until no further increases in the digital control word DVB result. As noted above, the number of times the digital phase error signal PHE exceeds the threshold value is an indication of the phase noise that one seeks to reduce by finding the optimal value of digital control word DVB. FIG. 7(*b*) illustrates the minimum phase noise point, i.e., the point with the lowest phase noise. A threshold value is also shown that represents a high phase noise value. Setting the threshold value at a higher phase noise value supports design applications that seek lower current consumption while tolerating a higher phase noise level.

The above embodiments determined a comparison between a digital phase error signal value and a threshold value. Based on this comparison, the digital control word DVB is adjusted. In other embodiments, a statistical parameter or other value associated with one or more digital phase error signal values may be used to form the comparison with the threshold value. For example, a mean value, a median value, a standard deviation value, a variance (and other statistical values or derived values) based on one or more values associated with the digital phase error signal values may be determined, and these one or more values are in turn compared with the threshold value.

Figure 8:
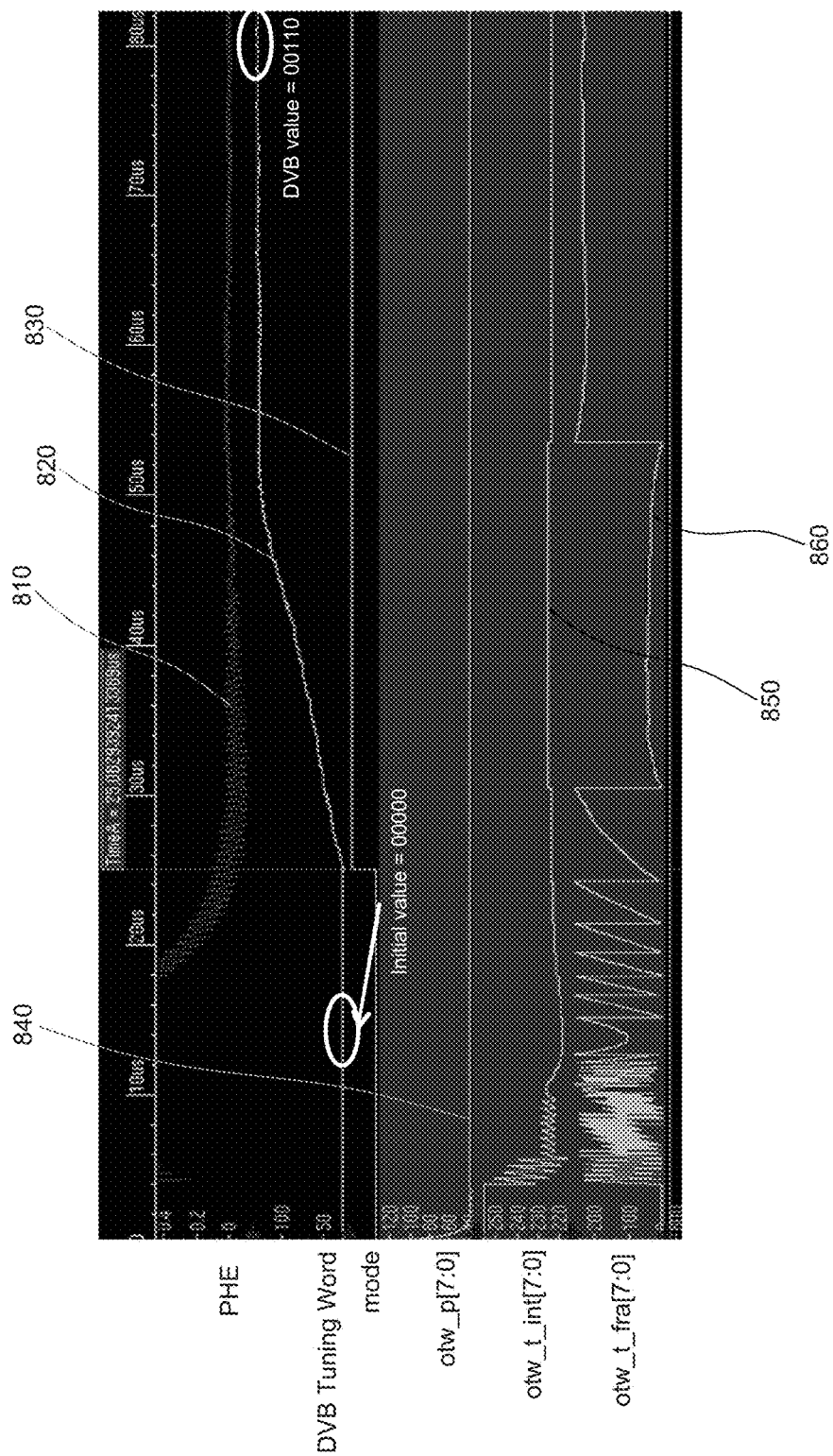
FIG. 8 illustrates simulation results of the calibration approach of FIG. 4 used with an ADPLL and DCO, in accordance with some embodiments.

Simulations have been performed on an embodiment of the present approach, as illustrated in FIG. 8. FIG. 8 shows the variation of a number of signals as a function of time. Digital phase error signal PHE 810 is plotted as a function of time from 0 μsec through to approximately 80 μsec. Digital control word DVB 820 is also plotted as a function of time from 0 μsec through to approximately 80 μsec. Mode signal 830, i.e., the signal that switches on the calibration mode described herein, is also plotted as a function of time. An example of mode signal 830 is the calibration mode signal discussed above that may be used to activate/deactivate the controller circuit such as dynamic VB controller 250. Oscillator tuning words (PVT) 840, oscillator tuning word (integer) 850 and oscillator tuning word (fractional) 860 are also plotted as a function of time. An example of oscillator tuning word (integer) 850 is shown as Track_I in FIG. 2. An example of oscillator tuning word (fractional) 860 is shown as Track_F in FIG. 2. FIG. 8 shows three separate time periods. In the first time period (through to approximately 25 μsec), the ADPLL circuit is in an acquisition (or locking) mode, and digital phase error signal 810 reduces as lock of the ADPLL circuit is achieved. One of ordinary skill in the art would understand prior to lock being achieved, the digital phase error signal 810 is large, and diminishes as lock is achieved during the acquisition mode. The acquisition mode is accomplished using oscillator tuning word (PVT) 840 that quickly reduces to zero as the acquisition process proceeds from time 0 through to approximately 25 μsec. During this first time period, the calibration approach described herein is inactive, as the mode signal 830 value of 0 reveals. Also during the first time period, the digital control word DVB 820 is set at its default value, which in an embodiment shown in FIG. 8, is binary 0. During this first time period, oscillator tuning word (integer) 850 and oscillator tuning word (fractional) 860 support the acquisition process. The calibration mode is not activated until the second time period.

Upon acquisition having been completed (or close to completion, which is approximately 25 μsec in the illustration of FIG. 8), an embodiment of the calibration mode is activated. Note that it may be advantageous for the calibration mode to be activated prior to the completion of the acquisition mode in order to reduce unnecessary energy consumption by the oscillator while an optimal operating point is determined. FIG. 8 illustrates the second time period (approximately 25 μsec through to 50 μsec), which begins when the mode signal 830 is set at binary 1 and the calibration mode begins. In response, the digital control word DVB 820 value is increased from its starting point of binary 0 until it reaches a final level. During this same second time period, the digital phase error signal PHE 810 is reduced until it also reaches a low level. During the second time period, oscillator tuning word (PVT) 840, oscillator tuning word (integer) 850 and oscillator tuning word (fractional) 860 vary as follows. Oscillator tuning word (PVT) signal 840 is stable and unchanged since the ADPLL circuit has completed its acquisition mode. Oscillator tuning word (integer) 850 and oscillator tuning word (fractional) 860 undergo rapid changes during the acquisition mode, and provide an indication for how well the phase locking process has settled. As illustrated in FIG. 8, these two signals undergo a multitude of high rate of changes in the time frame 0 through approximately 12 μsec, but in the second time period are relatively stable. In particular, oscillator tuning word (integer) 850 shows very little variation, while the rate of changes of oscillator tuning word (fractional) 860 continues to become less frequent as time advances in the second time period. Thus, during the second time period, oscillator tuning word (integer) 850 is largely unchanged other than to accommodate fractional word changes in oscillator tuning word (fractional) 860 at the integer boundary. In the third time period from 50 through 80 μsec, the digital control word DVB 820 value has stabilized at its optimal point for operation of the ADPLL circuit. All other signals are stable, with the exception of oscillator tuning word (fractional) 860 that shows evidence of bit noise (i.e., changes in a single bit as a result of the ever-present noise in an electronic system).

Figure 9:
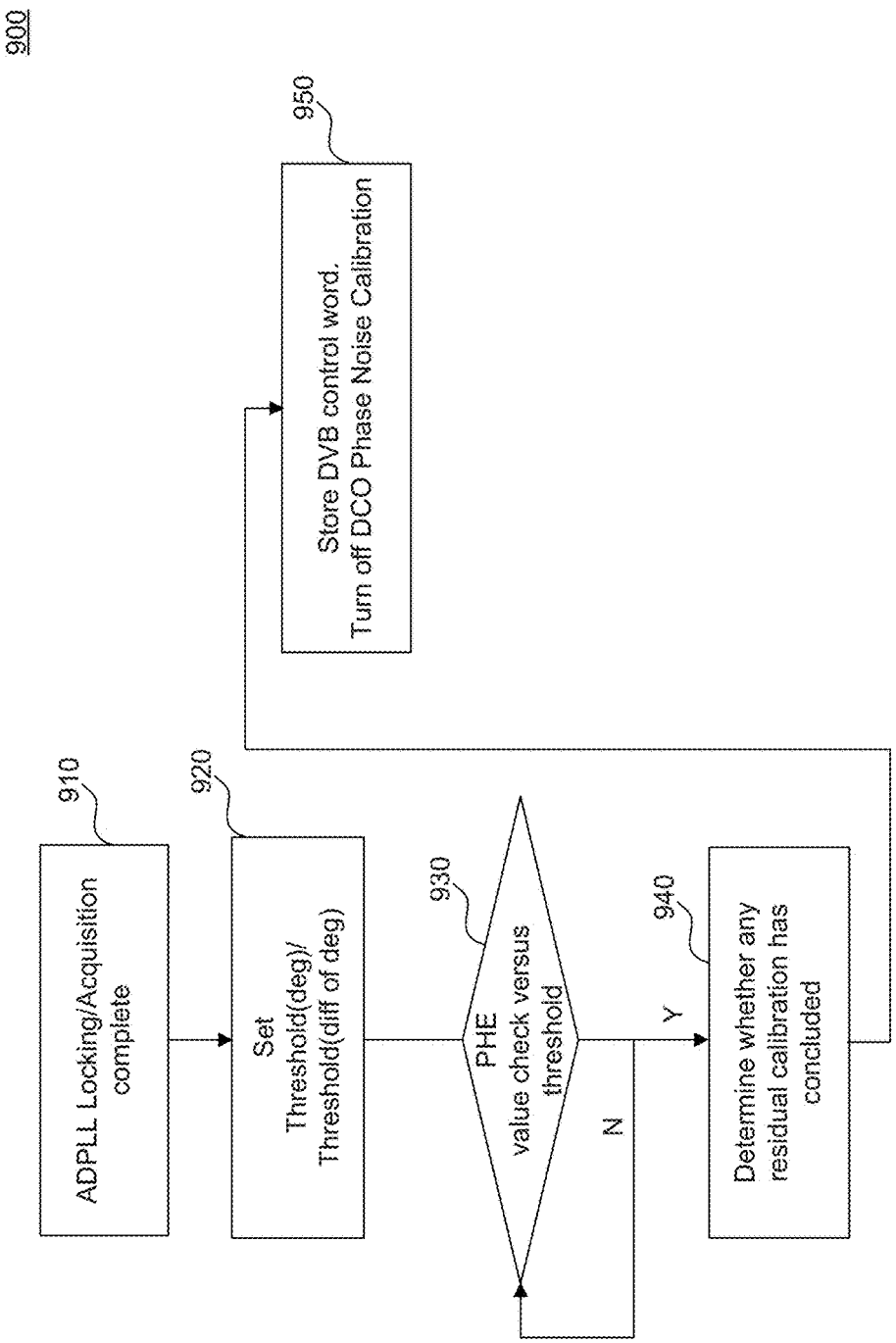
FIG. 9 illustrates an example method, in accordance with some embodiments.

FIG. 9 reveals a method 900 of calibration of an ADPLL circuit, in accordance with an embodiment of the present approach. Step 910 identifies whether the ADPLL locking (or acquisition) process has completed. As an alternative to step 910, the method may determine whether the ADPLL locking (or acquisition) process has sufficiently settled, even though it has not completed concluded. In step 920, a threshold level of the digital phase error signal PHE is set. In one embodiment, the threshold level is an absolute value of phase error as shown in FIG. 6(*a*). As noted above, setting the threshold at such a value acknowledges the presence of thermal noise that is ever-present in an electrical system. In another embodiment, the threshold level is a difference value in phase error as shown in FIG. 7(*a*). In various embodiments, the threshold setting can be made in units of degrees. In other embodiments, the threshold setting can be made in other units, such as radians or other units or proxy values. In step 930, the value of digital phase error (or difference of digital phase error) is checked and compared with the threshold level. If the comparison reveals that the digital phase error PHE (or difference of digital phase error) exceeds the threshold level, then the digital control word DVB of FIG. 6(*a*) or FIG. 7(*a*) is adjusted to increase the bias current of the DCO. Following such an increase, the comparison and digital control word DVB adjustment in step 930 is re-done until the digital phase error PHE does not exceed the threshold level. When the comparison reveals that the digital phase error PHE (or difference of phase error) does not exceed the threshold value, the loop is complete. Step 940 determines when any residual calibration has concluded. In step 950, the final value of the digital control word DVB from the above iterative step is stored for this chip, and the DCO phase noise calibration procedure is completed.

The approach described herein is superior in that the actual DCO phase noise performance is the basis of the calibration procedure, rather than using a predetermined reference voltage value used by other approaches. Furthermore, the present approach enables each ADPLL/DCO chip to be calibrated in the manner described above. Thus, for each ADPLL/DCO chip, the effects of any variable factors such as process, voltage and temperature (PVT) are incorporated into the calibration procedure without the need for the time consuming and expensive use of external test equipment. In addition, should any of these or other variable factors change, the calibration procedure may be readily repeated. For example, the calibration procedure described herein may be repeated at various intervals to address changes in variable factors, such as temperature or voltage supply variation. For example, at a later time, the operating temperature may have increased or the voltage from a voltage supply may have decreased, with resulting changes in the phase noise characteristic of the ADPLL/DCO. In an exemplary embodiment, during a series of Bluetooth packet transmissions that use an ADPLL/DCO, a calibration may be performed prior to, during or after each Bluetooth packet transmission. Alternatively, a calibration may be performed after a certain number of packet transmissions, or after a certain predetermined time interval. Note that in any subsequent calibration procedures of a particular ADPLL/DCO, the initial digital control word DVB may be a default value such as binary 0, or may be the value obtained from a previous calibration. For example, using the last known calibration value as a starting point would likely accelerate the calibration procedure. In an exemplary embodiment, in the simulation results shown in FIG. 8, the calibration procedure takes approximately 25 μsec. Using the last known calibration value as a starting point may reduce the time to complete to the calibration procedure to of the order of 1 or 2 μsec.

The above discussion provides an approach to the digitized calibration and tuning of digitally-controlled oscillators (DCOs) that accommodates process/voltage/temperature (PVT) variations. As noted above, at different times, the operating temperature may have increased (or the voltage from a voltage supply may have decreased) with resulting changes in the phase noise characteristic of the ADPLL/DCO. By performing subsequent calibrations, the effects of, for example, changing temperature, may be accommodated. In various embodiments of the approach described above, the digital phase error signal of the ADPLL circuit is monitored to determine an optimal operating point of the DCO. As noted above, an optimal operating point of the DCO is reached when no further increases in the digital control word DVB result in a reduction in the digital phase error signal PHE. This approach is superior in a number of ways to prior approaches, since monitoring the phase error signal provides a direct evaluation of the DCO performance, and this approach avoids the costly and time consuming approach of connection and testing with external test equipment.

Furthermore, calibration may be readily initiated at any point in time so that the impact of process/voltage/temperature (PVT) variations is eliminated. As noted above, at different times, the operating temperature may have increased (or the voltage from a voltage supply may have decreased) with resulting changes in the phase noise characteristic of the ADPLL/DCO. By performing subsequent calibrations, the effects of, for example, changing temperature, may be accommodated. These advantages are particularly relevant to support, for example, the Internet of Things (IoT) market segment and the wearable applications market segment. Both the IoT market segment and the wearable applications market segment are emerging areas where low power consumption is a critical constraint. However, neither devices for the IoT segment nor many of the wearable application devices may be battery operated or connected to a power supply. Instead, these devices need to support ultralow power consumption constraints. In these scenarios, the designs may seek lower current consumption of the oscillator circuits while tolerating a higher than the minimum phase noise values attainable from these same oscillator circuits. The above approach is superior to other approaches in that it allows a determination of the optimal phase noise performance without requiring excess current consumption of the oscillator design. More particularly, it permits the targeting of a desired phase noise performance at a particular (low) level of current consumption by setting of an appropriate threshold value.

In addition to the above power consumption design constraints, there is an inexorable trend to digitize circuits, including RF circuits. Digitization of circuits leads to a level of control. predictability, reproducibility and scalability that cannot be easily obtained with their analog equivalents. The above calibration approach of the present disclosure is also superior to other approaches in that it supports the digitization of calibration and tuning of digitally-controlled oscillators (DCOs). First, monitoring the digital phase error signal provides a direct digital evaluation of the DCO performance. This is in contrast to other approaches that rely on an indirect or proxy analog parameter (e.g., a reference amplitude) for the actual oscillator performance. Second, the phase error signal in various embodiments of the present approach is a digital signal, which readily supports a digitization of the tuning and calibration procedure. In certain embodiments of the present approach, statistical evaluations of successive values of the digital phase error signal are readily supported that may be used to further add innovation of making adjustments to the operating point of the DCO core.

In other embodiments, a circuit has been described that includes a digitally-controlled oscillator (DCO) that is configured for generating an oscillator output signal at an operating point based in part on a digital control word. A phase locked loop (PLL) circuit is coupled to the oscillator output signal that locks the oscillator output signal to an input reference signal while providing a digital phase error signal. A controller circuit is coupled to the digital phase error signal, which adjusts the digital control word in response to a relationship between the digital phase error signal and a threshold value.

In some embodiments, a circuit is described that includes a digitally-controlled oscillator (DCO) that generates an oscillator output signal at an operating point that is based in part on a digital control word. A phase locked loop (PLL) circuit is coupled to the oscillator output signal that locks the oscillator output signal to an input reference signal, while providing a digital phase error signal. A controller circuit is coupled to the digital phase error signal, which adjusts the digital control word in response to a relationship between the digital phase error signal and a threshold value. The controller circuit includes a resistor ladder network that outputs an adjustable voltage that is based on the digital control word. The adjustable voltage is coupled to the DCO. The controller circuit is activated based on a mode setting.

In some embodiments, a method is described that includes generating an oscillator output signal at an operating point based in part on a digital control word. The method also includes locking the oscillator output signal to an input reference signal, and using a digital phase error signal. The method also includes adjusting the digital control word in response to a relationship between the digital phase error signal and a threshold value.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase locked loop (PLL) circuit, comprising:
    a digitally-controlled oscillator (DCO) configured to generate an oscillator output signal at an operating point based in part on a digital control word, wherein the DCO comprises a cross-coupled transistor pair that provides the oscillator output signal;
    a locking circuit coupled to the oscillator output signal, and configured to lock the oscillator output signal to an input reference signal and to output a digital phase error signal; and
    a controller circuit coupled to the digital phase error signal, and configured to adjust the digital control word in response to a comparison between one or more values associated with the digital phase error signal and a threshold value.

2. The PLL circuit of claim 1, wherein the digital control word sets an operating point of the DCO.

3. The PLL circuit of claim 1, wherein the one or more values is a present value of the digital phase error signal.

4. The PLL circuit of claim 1, wherein the one or more values is a difference between successive values of the digital phase error signal.

5. The PLL circuit of claim 1, wherein the digital control word is initially set to a default value.

6. The PLL circuit of claim 1, wherein the digital control word is initially set to a previously computed calibration value.

7. The PLL circuit of claim 1, wherein the one or more values is one of a mean, a median, a standard deviation, or a variance of two or more values of the digital phase error signal.

8. The PLL circuit of claim 1, wherein the controller circuit comprises:
    a comparator configured to provide an output that is the comparison between the one or more values associated with the digital phase error signal and the threshold value, the one or more values being a present value of the digital phase error signal; and
    a multiplexer configured to select an adjusted digital control word or a previous digital control word based on the output of the comparator.

9. The PLL circuit of claim 1, wherein the controller circuit comprises:
    a differentiator circuit configured to provide an output that is the one or more values wherein the one or more values is a subtraction between successive values of the digital phase error signal;
    a comparator configured to provide an output based on a comparison between the output of the differentiator circuit and the threshold value; and
    a multiplexer configured to select an adjusted digital control word or a previous digital control word based on the output of the comparator.

10. A phase locked loop (PLL) circuit, comprising:
    a digitally-controlled oscillator (DCO) configured to generate an oscillator output signal at an operating point based in part on a digital control word;
    a locking circuit coupled to the oscillator output signal, and configured to lock the oscillator output signal to an input reference signal and to output a digital phase error signal; and
    a controller circuit coupled to the digital phase error signal, and configured to adjust the digital control word in response to a comparison between one or more values associated with the digital phase error signal and a threshold value, the controller circuit comprising:
        a resistor ladder network configured to output a voltage that is adjustable based on the digital control word, the DCO being coupled to the voltage output from the resistor ladder network.

11. The PLL circuit of claim 10, wherein the controller circuit is further configured to be activated based on a mode setting and the mode setting activates the controller circuit upon completion of an acquisition procedure by the PLL circuit.

12. The PLL circuit of claim 10, wherein the controller circuit is further configured to be activated based on a mode setting and the mode setting activates the controller circuit upon a partial completion of an acquisition procedure by the PLL circuit.

13. The PLL circuit of claim 10, wherein the controller circuit is further configured to be activated based on a mode setting and the mode setting activates the controller circuit upon an indication of a data packet transfer.

14. A method, comprising:
    outputting a control output signal from a resistor ladder network, wherein the control output signal is adjustable based on a digital control word;
    generating, by a digitally-controlled oscillator (DCO), an oscillator output signal at an operating point based in part on the control output signal, wherein the DCO is coupled to the control output signal from the resistor ladder network;

locking the oscillator output signal to an input reference signal, wherein the locking includes using a digital phase error signal; and adjusting the digital control word in response to a comparison between one or more values associated with the digital phase error signal and a threshold value.

15. The method of claim 14, wherein adjusting the digital control word includes comparing the one or more values and the threshold value wherein the one or more values is a present value of the digital phase error signal.

16. The method of claim 14, wherein adjusting the digital control word includes:

determining the one or more values wherein the one or more values is a difference between successive values of the digital phase error signal; and comparing the difference with the threshold value.

17. The method of claim 14, further comprising:

setting the digital control word to a previously computed calibration value.

18. The method of claim 14, wherein adjusting the digital control word is performed in response to a change in temperature.

19. The method of claim 14, wherein adjusting the digital control word is performed after a predetermined time interval.

20. The method of claim 14, wherein adjusting the digital control word is performed after a predetermined number of packet transmissions processed by circuitry that includes the DCO.

* * * * *